United States Patent [19]

Conover

[11] Patent Number: 4,922,191
[45] Date of Patent: May 1, 1990

[54] ELECTRONIC TESTING EQUIPMENT INTERCONNECTION ASSEMBLY

[75] Inventor: Philip Conover, San Diego, Calif.

[73] Assignee: General Dynamics Corporation, Electronics Division, San Diego, Calif.

[21] Appl. No.: 278,654

[22] Filed: Nov. 30, 1988

[51] Int. Cl.$^5$ .............................................. G01R 1/04
[52] U.S. Cl. ................................................ 324/158 F
[58] Field of Search ............ 324/158 F, 73 PC, 158 P; 439/65–67, 86–91

[56] References Cited

U.S. PATENT DOCUMENTS

| | | | |
|---|---|---|---|
| 4,201,435 | 5/1988 | Nakamura et al. | 439/91 |
| 4,417,204 | 11/1983 | Dehmel et al. | 324/158 F |
| 4,468,616 | 8/1984 | Yoshizakt | 324/158 F |
| 4,547,834 | 10/1985 | Dumont et al. | 439/66 |
| 4,686,608 | 8/1987 | Hosking | 361/428 |

*Primary Examiner*—Reinhard J. Eisenzopf
*Assistant Examiner*—Edward Urban
*Attorney, Agent, or Firm*—Brown, Martin, Haller & McClain

[57] ABSTRACT

An interconnection assembly for connecting a unit under test to a testing unit including a plurality of spaced parallel circuit cards, the interconnection row assembly comprising of connector terminals adjacent the outer edges of each circuit card, an interface test adapter unit containing signal relaying circuitry for relaying the appropriate signals back and forth between the test unit and the unit under test, the interface unit having connectors for connection to the unit under test, and an outer face carrying connector terminals for connection to respective connector terminals on the circuit cards. A coupling mechanism releasably couples the units together with the outer face of the adapter unit facing the outer edges of the circuit cards. A connecting assembly electrically connects the terminals on one unit to the appropriate terminals on the other unit, the assembly comprising a series of conductors for electrically contacting each terminal on one unit and the corresponding terminals on the other unit, and a biassing assembly for biassing the conductors into surface contact with the appropriate terminals.

14 Claims, 5 Drawing Sheets

ELECTRONIC TESTING EQUIPMENT INTERCONNECTION ASSEMBLY

BACKGROUND OF THE INVENTION

The present invention relates generally to automatic testing equipment for testing various electronic devices, and more particularly to an interconnection assembly or arrangement for connecting the equipment.

Electronic testing equipment consists generally of an automatic testing unit or test station containing circuitry or hardware for testing various types of electronic devices, and an interface test adapter or interface unit containing the necessary hardware to relay the correct signals back and forth between the test station and the device under test. Such equipment is widely used, for example, in the military aircraft industry for testing the many different types of electronic devices used in the various aircraft. A single test station may be required to test more than 50 different types of electronic devices. Each specific device requires a different interface test adapter, to ensure that the correct signals for testing that particular device are relayed between the units.

Interface test adapters typically consist of a large metal box with hundreds of pins projecting from one end for connection to corresponding sockets on the testing unit, and cable connectors projecting from the other end for connection to the device under test. Inside the box is a mass of wires, terminal boards and printed wiring boards which transfer the correct electronic signals back and forth between the testing unit and the device under test. Since these boxes are necessarily very large, storage space is quite a problem where over 50 different boxes must be stored for each testing unit or station.

The interface unit is connected to the test station by lifting it onto a holding frame and applying considerable pressure with a lever arm to join all of the pins and sockets. Any misalignment or mishandling could result in damage to the pin and socket connectors.

SUMMARY OF THE INVENTION

It is an object of the present invention to provide an improved interconnection assembly for electronic testing equipment.

According to the present invention, an interconnection assembly is provided, which comprises a testing unit including a plurality of spaced, parallel circuit cards each having a first edge with a plurality of connector terminals extending adjacent that edge, an interface unit for connecting the testing unit to a device under test, the interface unit having connectors for connection to the device under test, and an end face having spaced parallel rows of connector terminals, a coupling assembly for releasably securing the units together with the first edges of the circuit cards facing the end face of the interface unit, and an interface connecting assembly for connecting the terminals on one unit to corresponding terminals on the other unit, the connecting assembly being secured to one of the units, and comprising conductors for electrically contacting each terminal on one unit and a corresponding terminal on the other unit, and biassing devices for biassing the conductors into contact with the respective terminals.

When the interface unit is coupled to the testing unit, the connecting assembly is sandwiched between the testing unit terminals and the interface unit terminals. In a preferred embodiment of the invention, the terminals on the interface unit are arranged in a series of rows, one each for each of the rows of terminals on the circuit cards. In one embodiment, the connecting assembly comprises a plurality of strips of resilient material having alternating conductive and non-conductive areas, each strip extending across a respective row of terminals on one of the units to which the connecting assembly is secured, with each terminal in contact with at least one of the conductive areas. When the units are coupled together, the strips are sandwiched between the respective rows of terminals on the two units, and each terminal on the other unit contacts at least one of the conductive areas which is also in contact with a corresponding aligned terminal on the first unit. Preferably, each terminal contacts more than one conductive area, to compensate for any misalignment. The resilient nature of the strip applies surface pressure on the conductive strips to bias them into contact with the respective terminals.

The connector strips may be elastomeric connectors, comprising strips of elastomeric material with conductive areas formed by impregnating the material with conductive particles or by bonding metallic strips around the outside of the material. Alternatively, the strips may be of hard plastic, with openings in the plastic in which metal spring contacts are mounted, the spring contacts projecting out of the plastic strip to ensure good contact with the terminals. In another alternative, a flex-circuit arrangement may be used.

This arrangement provides connection between the units via surface pressure between mating, face to face conductors, eliminating the need for pin and socket connectors, thus also eliminating the risk of breaking or damaging the connector pins on repeated connection. There is no need for soldering.

Preferably, the connector assembly is mounted on the testing unit. This reduces the number of connector assemblies needed, since there is only one testing unit and many interface units per station. Thus only one connector assembly will be required for a plurality of interface units associated with each test station.

BRIEF DESCRIPTION OF THE DRAWINGS

The present invention will be better understood from the following detailed description of some preferred embodiments of the invention, taken in conjunction with the accompanying drawings, in which like reference numerals refer to like parts, and in which.

DESCRIPTION OF THE PREFERRED EMBODIMENTS

Figure 1:
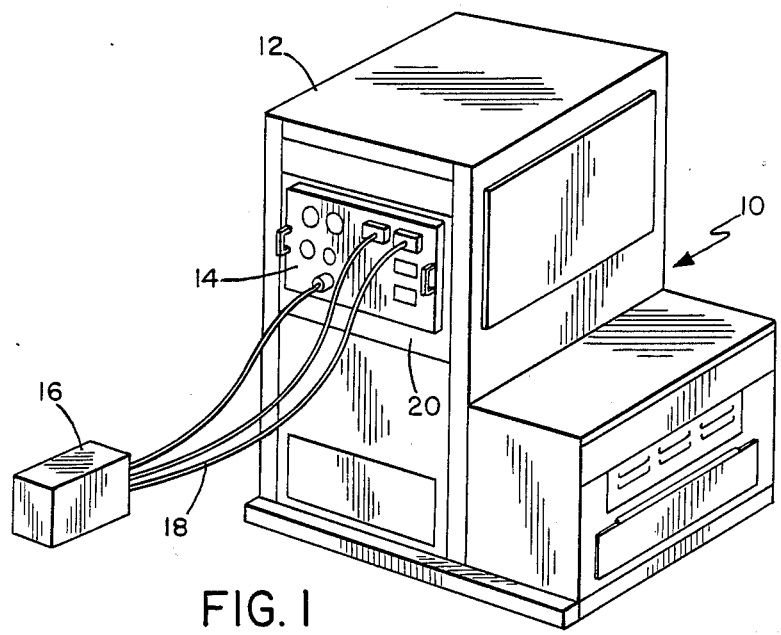
FIG. 1 illustrates the general set-up of test equipment in which a test station is connected to a unit under test via an interface test adapter utilizing an interconnection assembly according to the invention.

FIG. 1 illustrates the basic set up of a test station 10 for testing electronic units. The test station consists of an automatic test unit 12 and an interface test adapter 14 containing the necessary hardware for relaying the correct signals back and forth between the testing unit and the unit 16 under test. The unit 16 under test is connected to the interface test adapter 14 via cables 18. FIGS. 2 to 6 of the drawings illustrate a first embodiment of an interconnection assembly according to the invention for connecting the test unit 12 to the interface test adapter 14.

Figure 2:
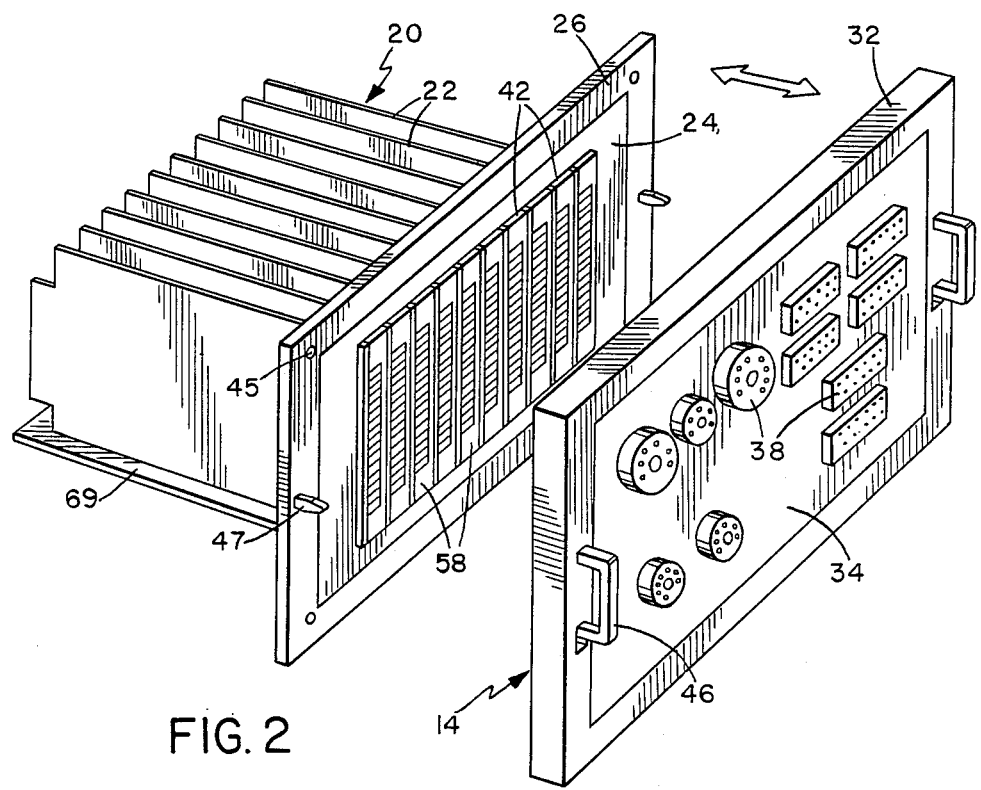
FIG. 2 is a perspective view illustrating an interconnection assembly between the test station and the interface test adapter according to a first embodiment of the invention.
Figure 3:
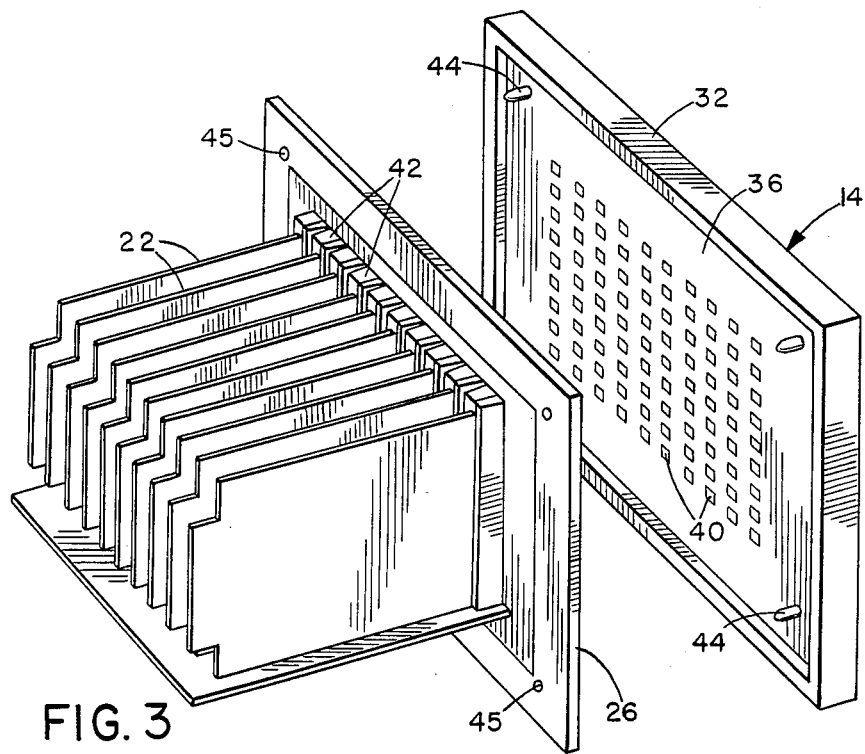
FIG. 3 is a similar view to FIG. 2 showing the interface test adapter side of the connection.
Figure 4:
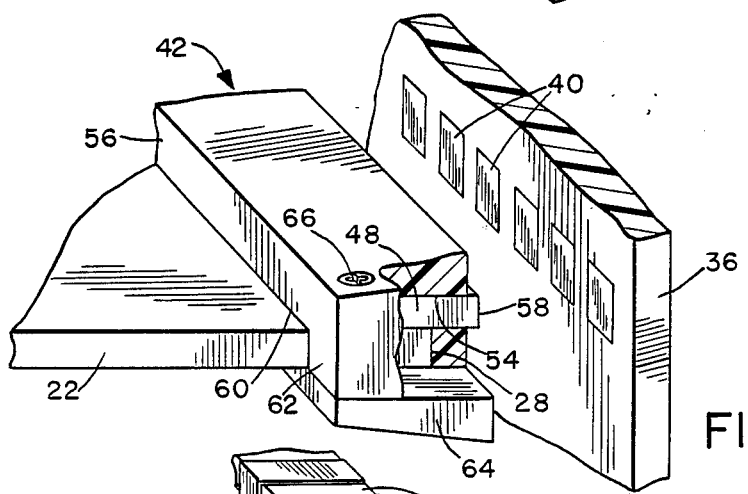
FIG. 4 is an exploded side elevation view, partially cut away, of one of the connectors used in the assembly of FIG. 2.
Figure 5:
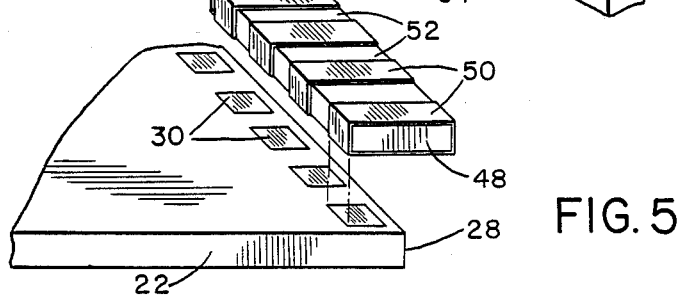
FIG. 5 is a perspective view illustrating the elastomeric connector strip used in the connector of FIG. 4.
Figure 6:
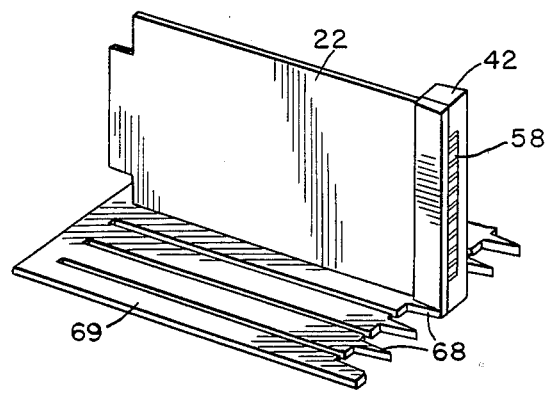
FIG. 6 illustrates the mounting of a circuit card having a connector as shown in FIG. 4 in the card cage.

As can be seen in FIG. 2, the test unit includes a card cage 20 in which a plurality of parallel, spaced circuit cards or printed wiring boards 22 are mounted. The circuit cards contain appropriate testing circuitry. The card cage has a front open face 24 surrounded by peripheral frame 26. The cards each have front edges 28 facing the front face of the card cage and lying in a common, vertical plane. As best shown in FIG. 5, each card has a row of connector terminals, pads or exposed traces 30 extending adjacent its first edge, which are connected to appropriate points on the circuit card or printed wiring board for signal transmission.

The interface test adapter unit consists of an outer frame 32 having opposing faces across which are mounted spaced panels 34, 36. A series of suitable cable connectors 38 are mounted across panel 34 for connection to cables 18 linking the unit to a unit under test. The other panel 36, which comprises a printed wiring board in the preferred embodiment of the invention, has terminals or contact pads 40 on its outer face for connection to corresponding terminals 30 on the circuit cards.

The terminals 30 and 40 are connected together by a connection assembly consisting of a series of connector units 42 each mounted on the front edge of a respective circuit card 22 for connecting the terminals 30 on that card to appropriate terminals or contact pads 40 on the outer face of the panel 36. A suitable coupling arrangement is provided for releasably coupling the interface test adapter 14 to the card cage so that the appropriate connections are made. In the embodiment illustrated in FIGS. 2 to 6, pins 44 projecting from the four corners of the outer face of the interface test adapter engage in corresponding holes 45 on the four corners of the card cage frame to align the interface test adapter with the card cage. Standard lever action handles 46 mounted on opposite sides of the interface test adapter frame 32 engage corresponding latches 47 on the card cage frame to secure the units together and apply the necessary pressure to ensure good connections are made between the terminals, as will be explained below.

The connector assembly or unit 42 will now be described in more detail. Each unit incorporates a suitable connector strip 48 which is designed to extend across the row of terminals on the circuit card, and to engage in face to face contact with the corresponding row of terminals 40 on the interface test adapter when the units are secured together. In the first embodiment illustrated in FIGS. 2 to 6, the connector strip 48 is an elastomeric connector, consisting of a strip of elastomeric material such as silicone, having alternating conductive and non-conductive sections 50,52 (see FIG. 5). Such connectors are commercially available and are commonly known as Zebra connectors. Since silicone is non-conductive, the conductive sections are made by either impregnating the silicone with conductive particles such as silver or by bonding metallic strips to the outside of the silicone strip. The connection from the test unit to the interface test adapter can be made simply by sandwiching the strip between the two sets of contacts, so that contact is made by surface pressure, eliminating the need for pin and socket connectors, soldered connections, and internal wiring. Elastomeric strips of this type are capable of making over 25 contacts per inch, and can carry up to 3 amps.

The connector assembly may be mounted on the card cage side or the interface test adapter side, but is preferably mounted on the card cage since this reduces the number of connector assemblies needed, as there will be only one test station for many different interface test adapters. In the embodiment illustrated in FIGS. 2 to 6, each connector assembly consists of a strip 48 mounted in a slot 54 in a wedge shaped, two part housing 56, with one side edge 58 of the strip projecting out of the outer end face of the housing for engagement with the interface test adapter terminals. The housing 56 has a slot 60 in its opposite end face for receiving the front edge of a circuit card 22, and the opposite sides 62,64 of the housing are bolted together by suitable bolts 66, which also act to clamp the end edge of the circuit card in place. Slots 54 and 60 communicate where they overlap so that appropriate conductive portions 50 on the connector strip can contact the exposed terminal pads 30 on the circuit card, with the bolts 66 being tightened to ensure good contact is made. Preferably, several conductive portions contact each terminal pad 30 on the card and each corresponding pad 40 on the interface test adapter, so that in the case of a slight misalignment, the appropriate electrical connections will still be made.

The wedge shaped connector housings 56 provide dust protection for the circuit card edges and also enable accurate positioning. Preferably, the card cage is provided with correspondingly shaped slots or channels 68 in base plate 69 (see FIG. 6) for accurately positioning the connector strip relative to an attached interface adapter unit.

When the units are secured together, electrical connection between the appropriate terminals will be made by surface contact between the conductive portions and the respective terminals, with the compressed elastomeric material biasing the conductive portions against the respective terminals to ensure that a good connection is made.

Figure 12:
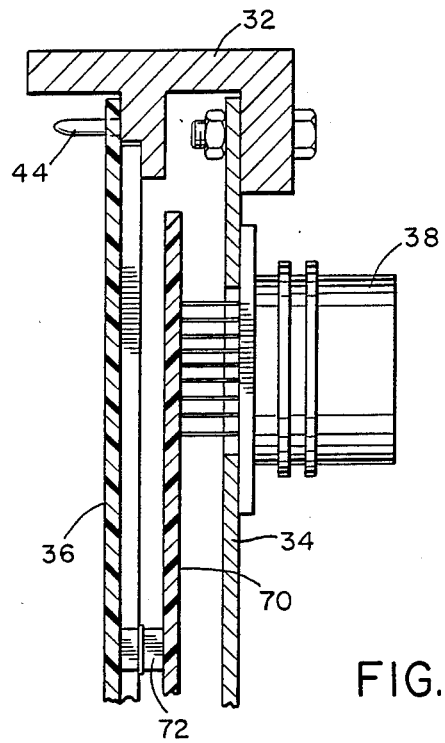
FIG. 12 is a partial cross-section through a first version of the interface test adapter unit used in the interconnection assembly.
Figure 13:
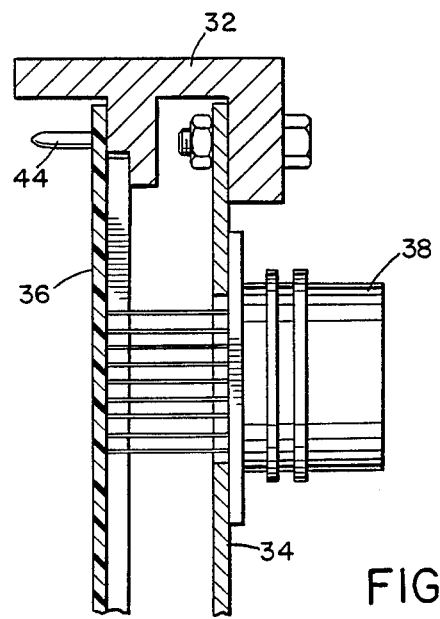
FIG. 13 illustrates an alternative version of the interface test adapter unit.

FIGS. 12 and 13 illustrate modified interface test adapters which can be used in the interconnection assembly described above. The elimination of pin and socket connectors between the card cage and interface test adapter also eliminates the need for internal wiring and solder connections. As described above, the outer panel 36 carrying contact terminals 40 may comprise a printed wiring board carrying some or all of the needed interface unit circuitry. FIGS. 12 and 13 illustrate two alternative arrangements for connecting the cable connectors 38 to appropriate points on printed wiring board 36. In FIG. 12, a second printed wiring board 70 is mounted in frame 32 between panels 34 and 36. The cable connectors 38 are connected to internal printed wiring board 70, and wiring board 70 may be connected to the outer board 36 in any suitable manner, for example via elastomeric connectors 72 as shown or via a flexible printed wiring board. FIG. 13 illustrates a modified interface test adapter in which outer printed wiring board 36 is connected directly to the printed wiring board surface mount type cable connectors 38, which project through suitable mounting openings in connector panel 34. In each case the test adapter is connected via cable connectors to the unit currently under test.

Thus the size, weight and cost of each interface test adapter can be reduced considerably with the interconnection assembly of this invention. This is significant, since a variety of different interface test adapters must be provided for each test station, one for each different type of unit to be tested. The reduced size will reduce storage area needed for these units, while the reduced weight will make changing from one interface test adapter to another considerably easier.

Figure 7:
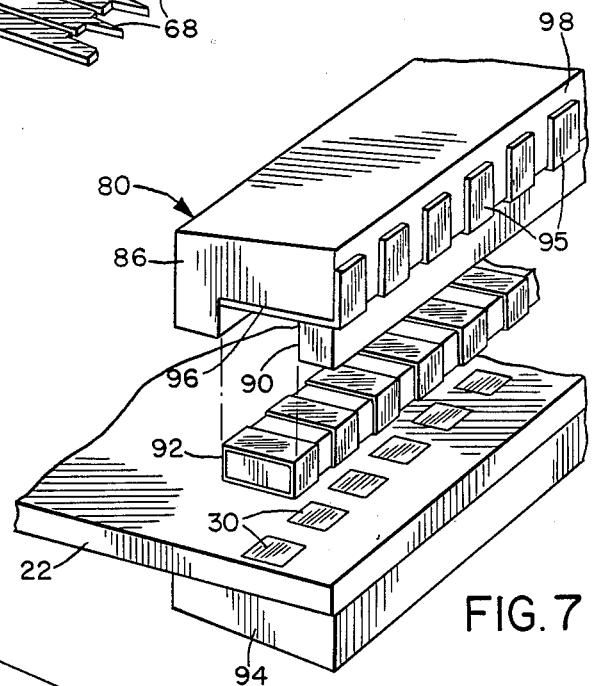
FIG. 7 illustrates a modified connector for mounting on the test station in an interconnection assembly according to a second embodiment of the invention.
Figure 8:
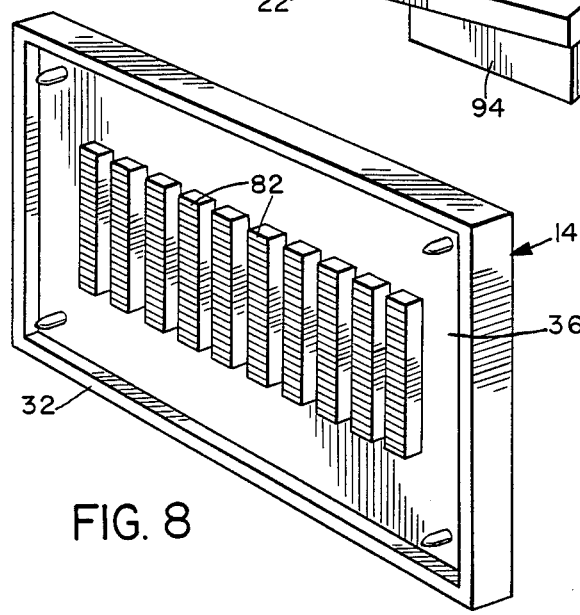
FIG. 8 illustrates the connection face of the interface test adapter unit in the embodiment of FIG. 7.

FIGS. 7 to 11 illustrate some modified connection assemblies according to the invention. Some parts shown in FIGS. 7 to 11 are equivalent to those in FIGS. 2 to 6, and like reference numerals have been used where appropriate. In the first embodiment, elastomeric strip connectors were used in a connector assembly mounted on the test unit card cage. FIGS. 7 and 8 illustrate a modified connection assembly in which connector terminals or exposed traces 30 on the circuit card or printed wiring board 22 are connected to corresponding terminals or traces on the interface test adapter printed wiring board via a connector unit 80 mounted on the edge of each circuit card which mates with a suitable connector strip 82 mounted across each row of terminals on the outer face of the interface test adapter. The connector unit 80 consists of a wedge shaped, two part housing 84 as in the first embodiment. However, in this case the first part 86 of the housing has a slot 90 facing inwardly towards the terminal carrying face of a circuit card held between the two parts of the housing, the slot 90 containing an elastomeric connector strip 92 of the same type as described above in connection with FIGS. 2 to 6. The first part 86 is suitably clamped or bolted to the second part 94 of the housing as in the first embodiment so as to clamp the edge of the circuit card between their opposed faces, as illustrated in FIG. 7.

A series of conductor traces 95, which may comprise exposed gold traces, for example, extend from the innermost face 96 of slot 90 and out to the outermost end face 98 of the housing 84. The exposed traces 94 mate with the connector strip 92 in slot 90, as well as with the corresponding connector strip mounted on the interface test adapter when the two units are secured together.

Figure 9:
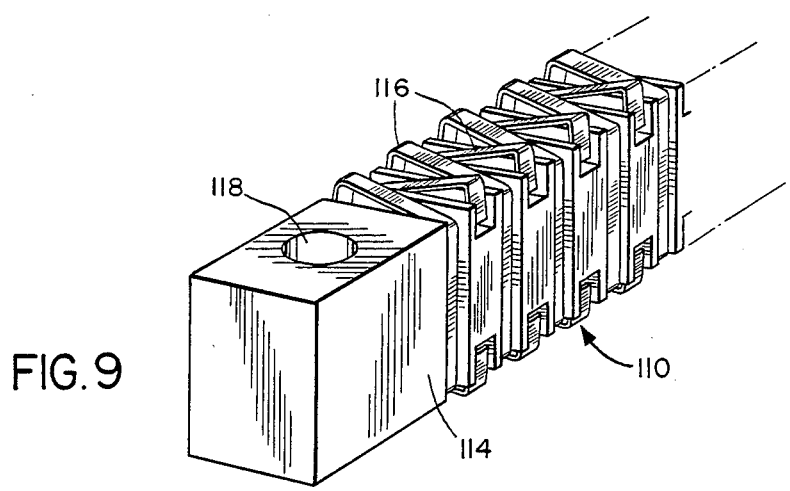
FIG. 9 is a perspective view of a spring connector strip for use in the interconnection assembly of FIG. 7 in an alternative embodiment of the invention.
Figure 10:
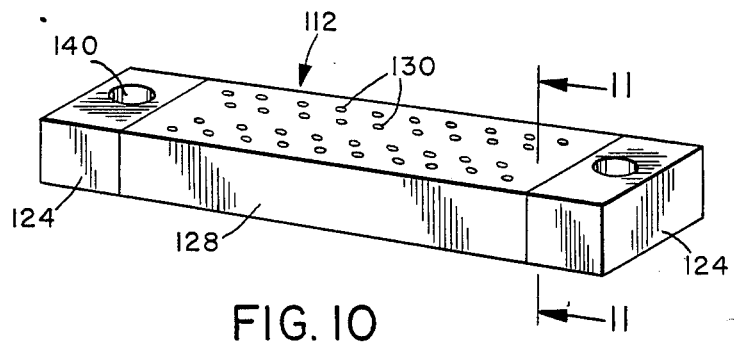
FIG. 10 is a similar view to FIG. 9 showing another alternative type of connector strip for use in the interconnection assembly of the invention.
Figure 11:
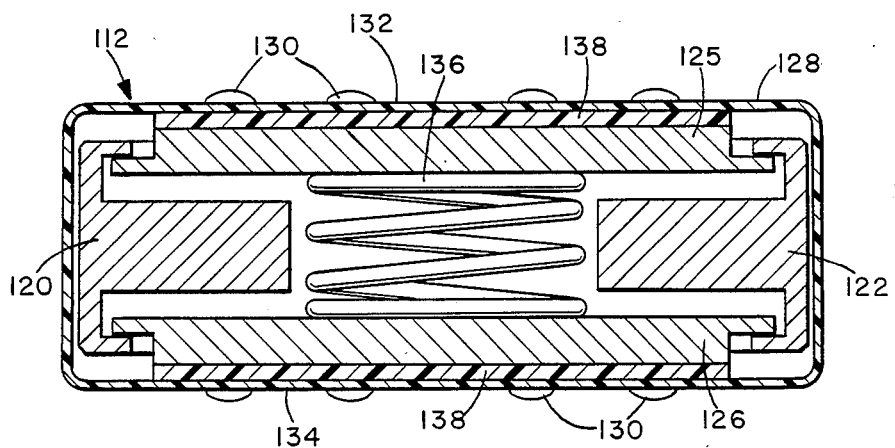
FIG. 11 is a cross-section on the lines 11—11 of FIG. 10.

The connector strips 82 and 92 may each comprise elastomeric connector strips, as in the connector unit of the first embodiment. Alternatively, other resilient strip connectors may be used for either strip 82 or 92, or both. For example, a spring connector assembly 110 as illustrated in FIG. 9 or a flexible circuit connector assembly 112 as illustrated in FIGS. 10 and 11, may be used. The spring connector assembly 110 is of a type known as the Surfmate connector (made by Methode Electronics) and consists of a strip 114 of rigid plastics material having slots on two opposite faces through which spring contacts 116 project. Suitable mounting holes 118 are provided at opposite ends of the strip. A series of these connectors 110 may be secured across the rows of terminals on the interface test adapter in place of strip 82, with the projecting spring contacts on one face contacting appropriate terminals, so that when the units are secured together the opposite, exposed ends of the spring contacts will contact the exposed traces on the outer face of each connector housing. Alternatively, the connectors 110 may be secured to the outer face 98 of each connector housing via bolts extending through the mounting holes 118, so that the innermost ends of the spring contacts are in contact with the exposed traces. When the units are connected together, the exposed ends of the spring contacts will contact the appropriate terminals on the interface test adapter. Strip 92 may also be replaced with a spring connector assembly as shown in FIG. 9, if desired.

The spring connector strip 110 will operate in a similar manner to the elastomeric strip connector of the previous embodiments. However, the conductors 116 will be stronger, wider and thicker and provide the desired spring action themselves. Only one spring contact will contact each terminal. The terminals on the interface test adapter will be patterned in the same way as in FIGS. 2 to 6.

The flexible circuit connector 112 illustrated in FIGS. 10 and 11 may also be mounted either on the terminal carrying face of the interface test adapter or on the outer face of the connector housing. A similar connector may also replace elastomeric strip 92. The connector 112 is a modification of a connector known as the Gold Dot connector, manufactured by Hughes. As illustrated in FIGS. 10 and 11, connector 112 consists of a rectangular, strip like enclosure formed by a pair of elongate, opposed channel members 120, 122 secured together at their opposite ends by end caps 124, and with opposed backplates 125, 126 extending between the channel members on the upper and lower faces of the enclosure. A flex circuit 128 extends around the outer surface of the enclosure, with gold dots or contacts 130 on opposed outer faces 132, 134 of the circuit. Flex circuits typically consist of an elastomeric backing material on which appropriate circuit traces are provided. Springs 136 act between the backplates 125, 126 as illustrated in FIG. 11 to provide the spring action and the necessary mating pressure for good surface to surface contact. Compression pads 138 between each backplate and the overlying portions of the flex circuit provide uniform pressure. Suitable mounting holes 140 are provided in end caps 124.

The illustrated gold dot connectors can therefore be mounted either on the outer face of each connector assembly 80 across the exposed traces 95 so that they contact the appropriate gold dots, or alternatively across the exposed terminals on the interface test adapter, with the gold dots, exposed terminals and contact traces being appropriately positioned to make the required connections between the appropriate terminals on the circuit cards and interface test adapter. Springs 136 will bias the gold dot contacts 130 against the appropriate terminals or traces, ensuring a good connection.

The flex circuit connector 112 therefore functions in a similar manner to the elastomeric strip and spring connectors described above. The only other difference in the connection assembly using this type of connector will be the exposed pads on the interface test adapter, which will be in a pattern configured to mate with the gold dots.

By using the interconnection assembly described above, the thickness of the interface test adapter can be reduced considerably. In the embodiments illustrated in FIGS. 12 and 13, which can be used in any of the described interconnection assemblies, the unit will be about one inch thick as compared to the ten inch thickness of traditional interface units. The compact interface test adapter unit is therefore lighter, smaller and easier to assemble than traditional units, and will take up considerably less storage space.

The connector assembly between the contact pads of the interface unit and the contact pads on the circuit cards eliminates the need for multiple pin and socket type connectors, thus eliminating the problems of bent or broken pins. Access for changes or repair to the connector assembly if needed will be quick and easy.

Although some preferred embodiments of the invention have been described above by way of example only, it will be understood by those skilled in the field that modifications may be made to the disclosed embodiment without departing from the scope of the invention, which is defined by the appended claims.

I claim:

1. Electronic testing equipment interconnection assembly, comprising:
    an electronic testing unit including a plurality of spaced, parallel circuit cards each having a row of flat connector pads positioned adjacent a first, outermost edge;
    an interface unit for electrically connecting the testing unit to a device under test, the interface unit having connecting means for connection to the device under test, and a series of spaced rows of connector pads on an outer face of the unit for connection to the testing unit;
    coupling means for releasably coupling the interface unit with the testing unit with the circuit cards perpendicular to the outer face of the interface unit;
    interface connecting means for electrically connecting the contact pads on the testing unit to corresponding contact pads on the interface unit, the interface connecting means comprising a series of elongate strips secured to a first one of the units, each strip having alternating conductive and non-conductive areas on at least two of its faces, each conductive area on one face being connected to a corresponding conductive area on the other face, and comprising conductive means for electrically contacting each connector pad on said one unit and the corresponding connector pad on the other unit, and biassing means for biassing said conductive means into contact with said respective terminal, each strip extending across a respective row of contact pads of said first unit with each pad in face to face contact with at least one of the conductive areas on one face of the strip;
    said coupling means further comprising positioning means for positioning said other unit with each row of contact pads extending parallel to and in alignment with a respective one of said strips; and
    said connecting means further comprising biassing means for biassing the conductive areas on the other face of each strip into electrical connection with contact pads on said other unit, said contact pads on said other unit each being connected to at least one of the conductive areas which is in contact with the corresponding contact pad on said first unit.

2. The assembly as claimed in claim 1, wherein the connector strips are secured to said testing unit and comprise strips of elastomeric material having alternating conductive and non-conductive areas, said connector pads on said interface unit comprising flat pads, said biassing means comprising housing means for retaining said strips with one face of each strip biased against the row of contacts on a respective circuit card and a perpendicular face biased against the corresponding rod of contact pads on said interface unit when said units are coupled together.

3. The assembly as claimed in claim 1, wherein the connector strips comprise strips of rigid, non-conductive material with spaced, resilient conductive members projecting through opposite faces of the strips at spaced intervals.

4. The assembly as claimed in claim 1, wherein the connector strips each comprise an elongate frame with a flex circuit extending around the frame and resilient means within the frame acting between opposite internal faces of the flex circuit.

5. The assembly as claimed in claim 3, wherein said housing means comprises a series of elongate housing members each secured to the outer edge of a respective card, each housing member having a slot in which said connector strip is mounted and which has an opening facing the row of terminals on the respective card on which the housing member is mounted, and including clamping means for clamping the card edge in the housing member and biassing the connector strip into engagement with the row of terminals.

6. The assembly as claimed in claim 5, wherein the housing member is wedge shaped.

7. The assembly as claimed in claim 5, wherein the housing member has a front face facing outwardly from the card cage, said slot having an opening in said front face and said connector strip projecting out of said opening.

8. The assembly as claimed in claim 1, wherein said interface test adapter unit comprises a peripheral frame having opposed open faces, at least one printed wiring board mounted across one open face of the frame and having said terminals on its outer face for connection to said circuit card terminals, and a connector panel mounted across the opposite open face of the frame, connector means for connection to a unit under test being mounted in said connector panel, and interconnection means within the unit for connecting the connector means to said printed wiring board.

9. The assembly as claimed in claim 1, wherein said interface test adapter unit comprises at least one printed wiring board carrying said signal relaying means, said wiring board having an outer face comprising said outer face of said unit on which said terminals are provided.

10. The assembly as claimed in claim 1, wherein said interface connecting means is secured to said electronic testing unit, said connecting strips each comprising a housing member secured to the outer edge of a respective card, said second face of said strips comprising an outer face of said housing facing towards a respective row of contact pads on said interface unit, said housing member having an internal slot having an opening facing the row of contact pads on said circuit card, and a connector strip mounted in said internal slot having alternating conductive and non-conductive areas at least on its outer face, said housing member including clamping means for clamping the card edge in the housing member and biassing the connector strip into contact with the row of contact pads, and said rows of contact pads on said interface unit each comprising a connector strip having an outer face with alternating conductive and non-conductive areas.

11. The assembly as claimed in claim 10, wherein each of said connector strips comprise strips of elastomeric material having alternating conductive and non-conductive areas.

12. The assembly as claimed in claim 10, wherein each of said connector strips on said testing unit and interface unit comprise strips of rigid, non-conductive material with spaced, resilient conductive members projecting through opposite faces of the strip at spaced intervals.

13. The assembly as claimed in claim 10, wherein each of the connector strips on said testing unit and interface unit comprise an elongate frame with a flex circuit extending around the frame and resilient means within the frame acting between opposite interval faces of the flex circuit.

14. The assembly as claimed in claim 1, wherein said positioning means comprises spaced guide pins on one of said units and corresponding spaced guide sockets on the other units for alignment and engagement with said guide pins when the two units are in the correct relative orientation.

* * * * *